US008421181B2

(12) United States Patent
Anderson et al.

(10) Patent No.: US 8,421,181 B2
(45) Date of Patent: Apr. 16, 2013

(54) SCHOTTKY BARRIER DIODE WITH PERIMETER CAPACITANCE WELL JUNCTION

(75) Inventors: Frederick G. Anderson, South Burlington, VT (US); Jenifer E. Lary, Hinesburg, VT (US); Robert M. Rassel, Colchester, VT (US); Mark E. Stidham, Bloomington, IN (US)

(73) Assignee: International Business Machines Corporation, Armonk, NY (US)

(*) Notice: Subject to any disclaimer, the term of this patent is extended or adjusted under 35 U.S.C. 154(b) by 307 days.

(21) Appl. No.: 12/840,791

(22) Filed: Jul. 21, 2010

(65) Prior Publication Data

US 2012/0018837 A1    Jan. 26, 2012

(51) Int. Cl.
*H01L 29/66* (2006.01)
(52) U.S. Cl.
USPC ............... 257/483; 257/471; 257/E29.338; 438/570; 438/92
(58) Field of Classification Search .......... 257/483
See application file for complete search history.

(56) References Cited

U.S. PATENT DOCUMENTS

| | | |
|---|---|---|
| 5,268,316 A | 12/1993 | Robinson et al. |
| 5,629,544 A | 5/1997 | Voldman et al. |
| 6,399,413 B1 | 6/2002 | Krutsick |

(Continued)

FOREIGN PATENT DOCUMENTS

| | | |
|---|---|---|
| JP | 57104272 | 6/1982 |
| JP | 1305564 | 12/1989 |
| JP | 2005229071 | 8/2005 |
| KR | 10-2007-00555867 | 5/2007 |

OTHER PUBLICATIONS

Jyrki Louhi, "The Capacitance of a Small Circular Schottky Diode for Submillimeter Wavelengths", IEEE Microwave and Guided Wave Letters, vol. 4, No. 4, Apr. 1994, pp. 107-108.

(Continued)

*Primary Examiner* — Ajay K Arora
(74) *Attorney, Agent, or Firm* — Gibb & Riley, LLC; Anthony J. Canale

(57) ABSTRACT

A Schottky barrier diode comprises a first-type substrate, a second-type well isolation region on the first-type substrate, and a first-type well region on the second-type well isolation region. With embodiments herein a feature referred to as a perimeter capacitance well junction ring is on the second-type well isolation region. A second-type well region is on the second-type well isolation region. The perimeter capacitance well junction ring is positioned between and separates the first-type well region and the second-type well region. A second-type contact region is on the second-type well region, and a first-type contact region contacts the inner portion of the first-type well region. The inner portion of the first-type well region is positioned within the center of the first-type contact region. Additionally, a first ohmic metallic layer is on the first-type contact region and a second ohmic metallic layer is on the first-type well region. The first ohmic metallic layer contacts the second ohmic metallic layer at a junction that makes up the Schottky barrier of the Schottky barrier diode.

24 Claims, 7 Drawing Sheets

U.S. PATENT DOCUMENTS

| | | |
|---|---|---|
| 7,098,521 B2 | 8/2006 | Coolbaugh et al. |
| 7,199,442 B2 | 4/2007 | Shenoy |
| 7,250,666 B2 | 7/2007 | Nowak |
| 7,382,035 B2 | 6/2008 | Shim et al. |
| 7,384,854 B2 | 6/2008 | Voldman |
| 2006/0125040 A1* | 6/2006 | Levin et al. .................. 257/471 |
| 2006/0180892 A1 | 8/2006 | Pardoen |
| 2006/0244050 A1 | 11/2006 | Sudou |
| 2008/0092094 A1* | 4/2008 | Coolbaugh et al. ............... 716/4 |
| 2009/0166795 A1 | 7/2009 | Yoon |
| 2009/0243027 A1 | 10/2009 | Kato et al. |
| 2009/0294865 A1 | 12/2009 | Tang et al. |

OTHER PUBLICATIONS

Behnam Jamali et al., "Design and Optimisation of Power Rectifiers for Passive RFID Systems in Monolithic CMOS Circuit", Proc. SPIE, vol. SPIE-6035, 2006, pp. 366-376.

Behnam Jamali et al., Design and Optimisation of Schottky Diodes in CMOS Technology With Application to Passive RFID Systems, SPIE, 2004, pp. 1-9.

PCT International Search Report, PCT/US2011/042296, Dated Feb. 29, 2012, pp. 1-9.

PCT International Search Report, PCT/US2011/042296, Dated Feb. 29, 2012, pp. 19.

* cited by examiner

SCHOTTKY BARRIER DIODE WITH PERIMETER CAPACITANCE WELL JUNCTION

BACKGROUND

The present invention relates to integrated circuit devices, and more specifically, to a Schottky barrier diode (SBD) integrated circuit device that includes a perimeter capacitance well junction.

A Schottky barrier is a potential barrier that is formed at the junction where a metal and semiconductor meet. The Schottky barrier is a form of a rectifier that works well as a diode. A Schottky barrier typically has a lower junction voltage, and decreased depletion width in the metal when compared to a standard p-n semiconductor junction. A metal-semiconductor junction acts as an ohmic contact if it does not rectify the current. The rectifying properties of a Schottky barrier depend on the metal's work function, the band gap of the intrinsic semiconductor, the type and concentration of dopants in the semiconductor, etc.

Conventional Schottky barrier diodes are limited by parasitic perimeter capacitance. The embodiments described below provide an improved Schottky barrier diode with a decreased anode to isolation junction capacitance in a p-type SBD and cathode to isolation junction capacitance in a n-type SBD. Thus, the embodiments herein provide substrate isolation with minimized perimeter capacitance for improved circuit performance.

SUMMARY

One exemplary embodiment herein comprises a semiconductor device, such as a Schottky barrier diode. In some embodiments herein, the Schottky barrier diode comprises a first-type substrate, a second-type well isolation region on the first-type substrate, and a first-type well region on the second-type well isolation region. With embodiments herein a feature referred to as a perimeter capacitance well junction ring is on the second-type well isolation region. A second-type well region is on the second-type well isolation region. The perimeter capacitance well junction ring is positioned between and separates the first-type well region and the second-type well region. A second-type contact region is on the second-type well region, and a first-type contact region contacts the inner portion of the first-type well region. The inner portion of the first-type well region is positioned within the center of the first-type contact region. Additionally, a first ohmic metallic layer is on the first-type contact region and a second ohmic metallic layer is on the first-type well region. The first ohmic metallic layer contacts the second ohmic metallic layer at a junction that makes up the Schottky barrier of the Schottky barrier diode.

Another, more specific, embodiment herein comprises a positive-type Schottky barrier diode which includes a positive-type substrate, a negative-type well isolation region that is positioned on and contacts the positive-type substrate, and a positive-type well region that is positioned on and contacts the negative-type well isolation region. Again, a perimeter capacitance well junction ring is positioned on and contacts the negative-type well isolation region. The perimeter capacitance well junction ring surrounds and contacts the positive-type well region. A negative-type well region is positioned on and contacts the negative-type well isolation region. The negative-type well region surrounds and contacts the perimeter capacitance well junction ring. The perimeter capacitance well junction ring is positioned between and separates the positive-type well region and the negative-type well region. A negative-type contact region is positioned on and contacts the negative-type well region, and a positive-type contact region surrounds and contacts the inner portion of the positive-type well region. The inner portion of the positive-type well region is positioned within the center of the positive-type contact region, and a shallow trench isolation ring is positioned on and contacts the perimeter capacitance well junction ring. The shallow trench isolation ring is positioned between and separates the negative-type contact region and the positive-type contact region. A first ohmic metallic layer is on the positive-type contact region, and a second ohmic metallic layer is on the positive-type well region. The first ohmic metallic layer contacts the second ohmic metallic layer at a junction that comprises a Schottky barrier of the Schottky barrier diode.

One embodiment herein is a method of forming a Schottky barrier diode. This exemplary method forms a second-type well isolation region on a first-type substrate, forms a first-type well region on the second-type well isolation region, and forms a perimeter capacitance well junction ring on the second-type well isolation region. The method also forms a second-type well region on the second-type well isolation region, such that the perimeter capacitance well junction ring is positioned between and separates the first-type well region and the second-type well region. Further, the method forms a second-type contact region on the second-type well region, and forms a first-type contact region that surrounds and contacts the inner portion of the first-type well region, such that the inner portion of the first-type well region is positioned within the center of the first-type contact region. Additionally, the method forms silicides on at least the first-type contact region and the first-type well region. The silicides form a first ohmic metallic layer on the first-type contact region, and a second ohmic metallic layer on the first-type well region. The first ohmic metallic layer contacts the second ohmic metallic layer at a junction that comprising a Schottky barrier of the Schottky barrier diode.

Another, more specific, method forms a positive-type Schottky barrier diode. This method forms a negative-type well isolation region on a positive-type substrate, and forms a positive-type well region on the negative-type well isolation region. This method also forms a perimeter capacitance well junction ring on the negative-type well isolation region, such that the perimeter capacitance well junction ring surrounds and contacts the positive-type well region. Additionally, the method forms a negative-type well region on the negative-type well isolation region, such that the negative-type well region surrounds and contacts the perimeter capacitance well junction ring, and such that the perimeter capacitance well junction ring is positioned between and separates the positive-type well region and the negative-type well region. The method forms a negative-type contact region on the negative-type well region, and also forms a positive-type contact region that surrounds and contacts the inner portion of the positive-type well region, such that the inner portion of the positive-type well region is positioned within the center of the positive-type contact region. The method also forms a shallow trench isolation ring on the perimeter capacitance well junction ring, such that the shallow trench isolation ring is positioned between and separates the negative-type contact region and the positive-type contact region. The method additionally forms silicides on the positive-type contact region and/or the positive-type well region. This process of forming the silicides forms a first ohmic metallic layer on the positive-type contact region, and a second ohmic metallic layer on the positive-type well region. The first ohmic metallic layer contacts the second ohmic metallic layer at a junction. This junction comprises a Schottky barrier of the Schottky barrier diode.

Also disclosed herein are embodiments of a design structure for the above-mentioned circuit. The design structure is embodied in a non-transitory machine readable medium used in a design process, said design structure comprising a Schottky barrier diode comprising a first-type substrate, a second-type well isolation region on the first-type substrate, and a first-type well region on the second-type well isolation region. With embodiments herein a feature referred to as a perimeter capacitance well junction ring is on the second-type well isolation region. A second-type well region is on the second-type well isolation region. The perimeter capacitance well junction ring is positioned between and separates the first-type well region and the second-type well region. A second-type contact region is on the second-type well region, and a first-type contact region contacts the inner portion of the first-type well region. The inner portion of the first-type well region is positioned within the center of the first-type contact region. Additionally, a first ohmic metallic layer is on the first-type contact region and a second ohmic metallic layer is on the first-type well region. The first ohmic metallic layer contacts the second ohmic metallic layer at a junction that makes up the Schottky barrier of the Schottky barrier diode. This design structure can be embodied in a machine-readable medium used in a design process, can reside on storage medium as a data format used for the exchange of layout data of integrated circuits. Furthermore, this design structure can comprise a netlist and can include test data, characterization data, verification data, and/or design specifications.

BRIEF DESCRIPTION OF THE DRAWINGS

The embodiments of the invention will be better understood from the following detailed description with reference to the drawings, which are not necessarily drawing to scale and in which.

DETAILED DESCRIPTION

As mentioned above, conventional Schottky barrier diodes are limited by perimeter capacitance. The embodiments described below provide an improved Schottky barrier diode with a decreased anode to isolation capacitance. Thus, the embodiments herein provide substrate isolation with minimized perimeter capacitance for improved circuit performance.

Figure 1:
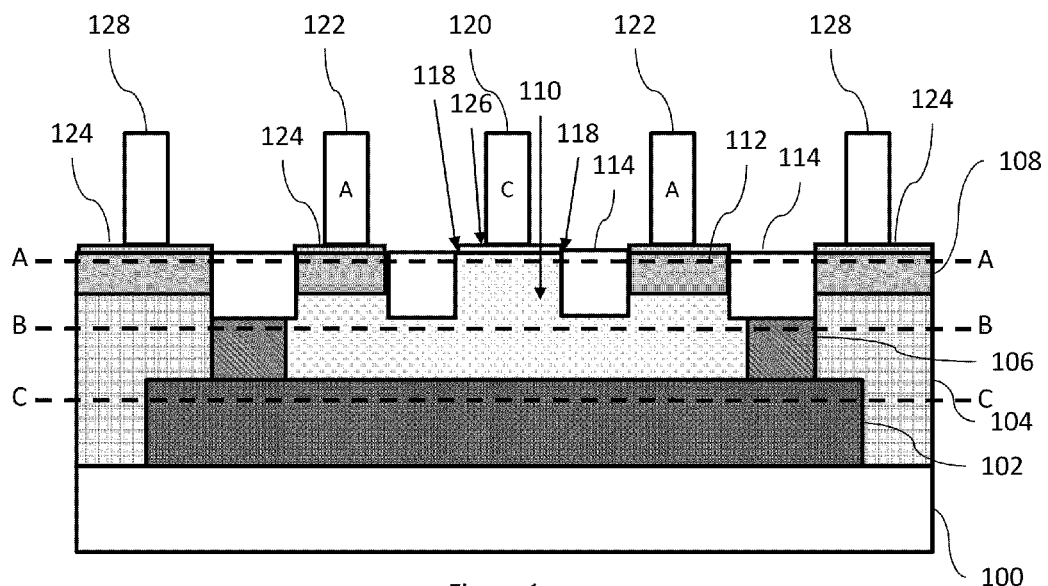
FIG. 1 is a cross-sectional schematic diagram of an integrated circuit according to embodiments herein.
Figure 2:
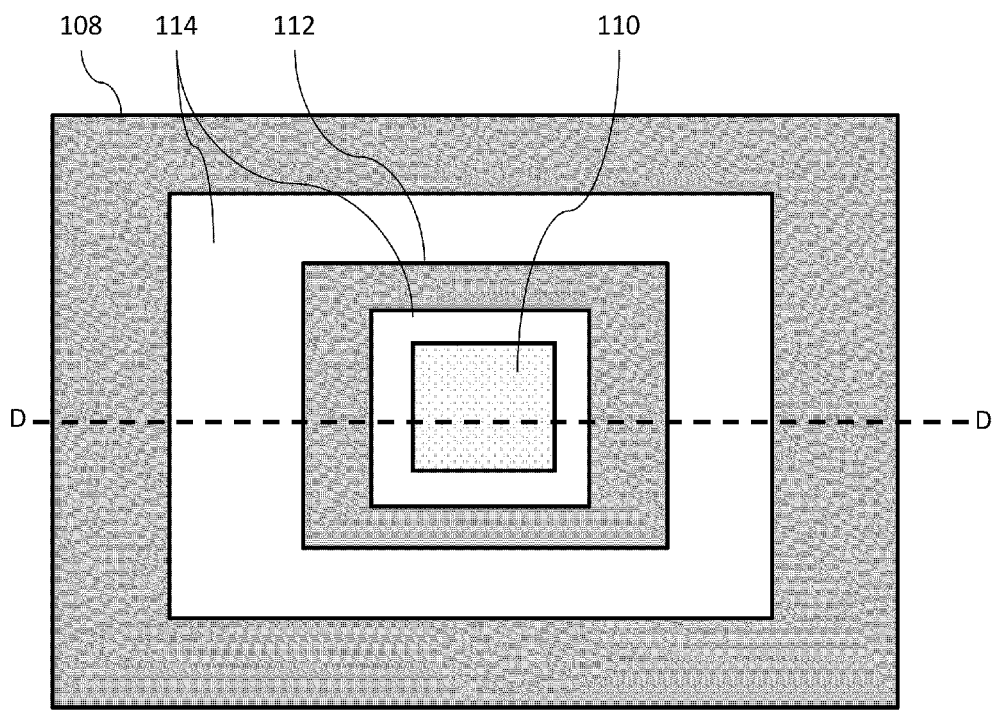
FIG. 2 is a top-view schematic diagram along line A-A of the integrated circuit shown in FIG. 1.
Figure 3:
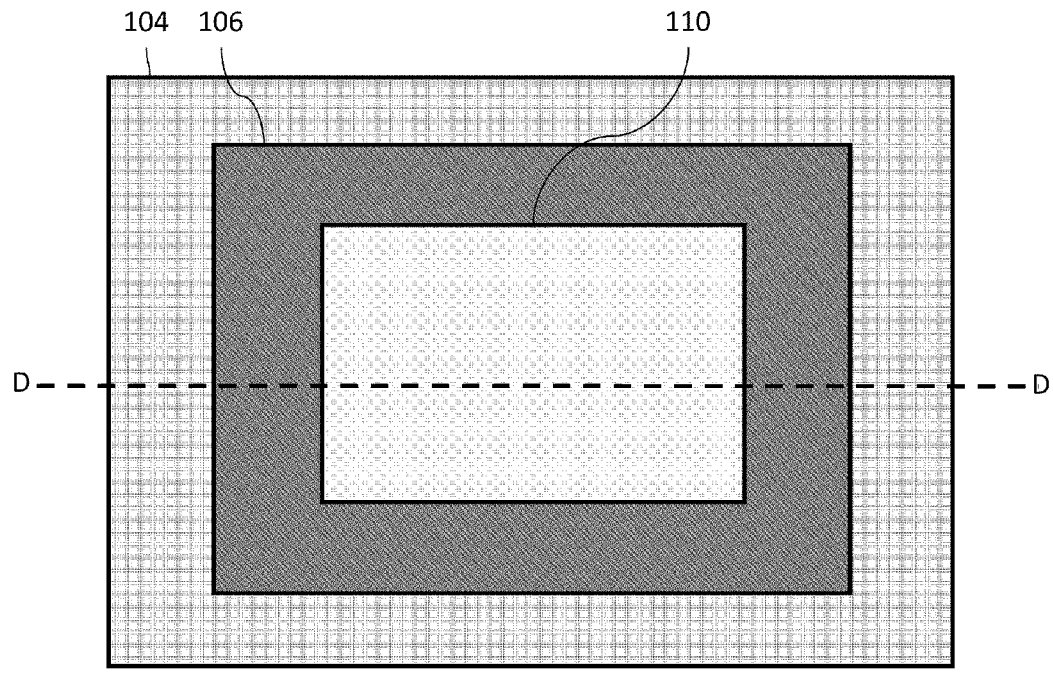
FIG. 3 is a top-view schematic diagram along line B-B of the integrated circuit shown in FIG. 1.
Figure 4:
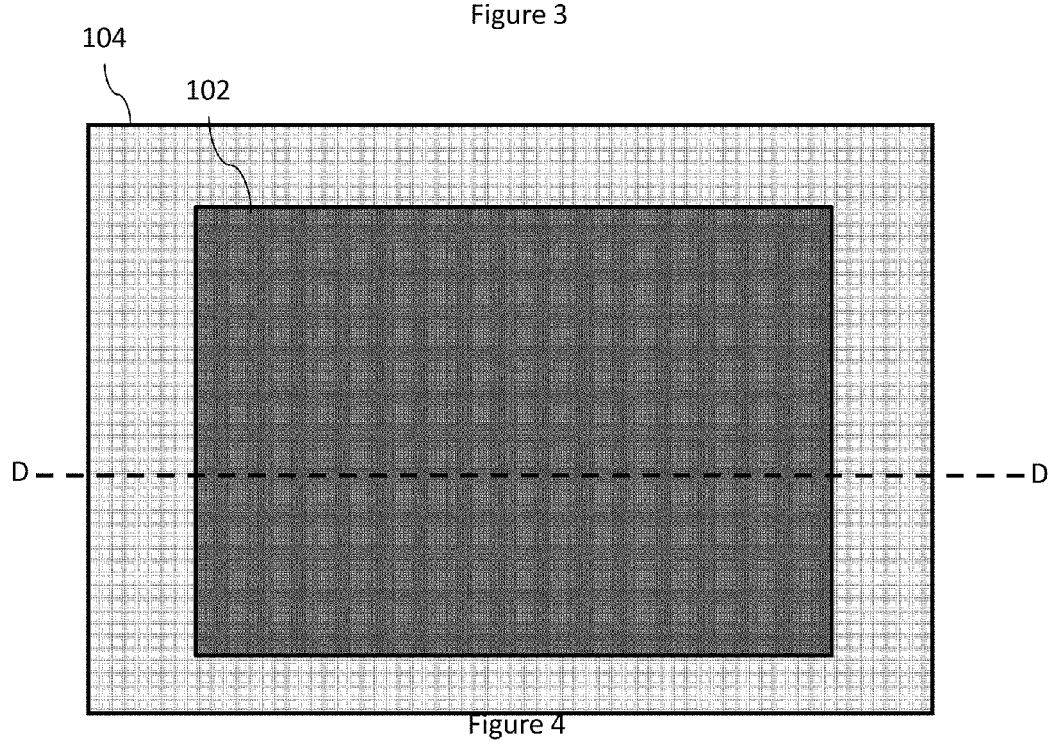
FIG. 4 is a top-view schematic diagram along line C-C of the integrated circuit shown in FIG. 1.

FIGS. 1-4 illustrate one example of how the embodiments herein utilize a perimeter capacitance well junction 106 to decrease the anode to isolation capacitance. FIGS. 1-4 illustrate the same structure from different perspectives. FIG. 1 illustrates the diode structure in cross-sectional view along the line D-D shown in FIGS. 2-4 where the p-type substrate 100 is arbitrarily referred to as the "bottom" of the structure and the contacts 120, 122, 128 are arbitrarily referred to as the "top" of the structure. FIGS. 2-4 respectively illustrate a top-view schematic along each of the lines A-A, B-B, and C-C in FIG. 1. Thus, FIG. 2 illustrates the structure along line A-A; FIG. 3 illustrates the structure along line B-B, and FIG. 4 illustrates the structure along line C-C.

The positive-type Schottky barrier diode shown in FIGS. 1-4 includes a positive-type substrate 100, and a negative-type well isolation region 102 that is positioned on and contacts the positive-type substrate 100. Further, a positive-type well region 110 is positioned on and contacts the negative-type well isolation region 102.

A perimeter capacitance well junction ring 106 is positioned on and contacts the negative-type well isolation region 102. As shown most clearly in FIG. 3, the perimeter capacitance well junction ring 106 surrounds and contacts the positive-type well region 110. The perimeter capacitance well junction ring 106 comprises an undoped material, a positively doped material having a doping concentration less than the positive-type well region 110, or a negatively doped material having a doping concentration less than the positive-type well region 110.

As shown in FIGS. 1 and 4, a negative-type well region 104 is positioned on, contacts, and surrounds the negative-type well isolation region 102. The negative-type well region 104 has a lower portion that contacts the positive-type substrate 100. As shown in FIG. 4, the lower portion of the negative-type well region 104 contacts and surrounds the negative-type well isolation region 102.

As shown in FIG. 3, the negative-type well region 104 also surrounds and contacts the perimeter capacitance well junction ring 106. As also shown in FIG. 3, the perimeter capacitance well junction ring 106 is positioned between and separates the positive-type well region 110 and the negative-type well region 104.

As shown in FIG. 1, a negative-type contact region 108 is positioned on and contacts the negative-type well region 104. As shown in FIGS. 1 and 2, a positive-type contact region 112 surrounds and contacts the inner portion of the positive-type well region 110. The negative-type contact region 108 has a greater doping concentration than the negative-type well region 104 and the positive-type contact region 112 has a greater doping concentration than the positive-type well region 110. The positive-type well region 110 has a lower portion that contacts the negative-type well isolation region 102. The inner portion (138 in FIG. 11) of the positive-type well region 110 has a smaller circumference than the lower portion (136 in FIG. 11) of the positive-type well region 110. The inner portion 138 of the positive-type well region 110 is positioned within the center of the positive-type contact region 112.

Further, as shown in FIG. 1, a shallow trench isolation ring 114 is positioned on and contacts the perimeter capacitance well junction ring 106. As shown in FIG. 2, the shallow trench isolation ring 114 is positioned between and separates the negative-type contact region 108 and the positive-type contact region 112.

As shown in FIG. 1, a first ohmic metallic layer 124 is positioned on and contacts the positive-type contact region 112, and a second ohmic metallic layer 126 is positioned on and contacts the positive-type well region 110. The first ohmic metallic layer 124 contacts the second ohmic metallic layer 126 at a junction 118 that comprises a Schottky barrier of the Schottky barrier diode. In addition, various conductive contacts are utilized to make connection to the different features within the structure shown in FIG. 1. More specifically, biasing contacts 128 allow the negative-type well regions 104 to be biased appropriately to allow the circuit optimum performance. Further, anode contacts 122 are made to the positive-type contact regions 112, and a cathode contact 120 is made to the positive-type well region 110.

Both non-linearity of the capacitance and the RC cutoff frequency of the Schottky barrier diode are of primary concern for RF circuit applications. The total device capacitance is a combination of intrinsic Schottky junction capacitance and extrinsic parasitic junction capacitance. The intrinsic capacitances of the Schottky barrier diode are driven by the Schottky junction which can be represented by following equation Csbdjctn=∈WjLj/d, where ∈ is the permitivity of semiconductor, Wj and Lj is the Schottky barrier junction width and length respectively, and d is the depth of the depleted space charge region. When scaling the device to minimum dimensions the Schottky junction capacitance is limited by depth of the depleted space charge region given by:

$$d = \sqrt{\frac{2\epsilon kT}{q^2 N_d} V_{bias}}.$$

For the extrinsic parasitic well junction capacitance a significant amount of the capacitance is driven by the perimeter capacitance well junction ring that is positioned between and separates the first-type well region and the second-type well region. This p-n junction from the reverse biased perimeter capacitance well junction is given by Cring=∈WrLr/dring, where ∈ is the permitivity of semiconductor, Wr & Lr is perimeter capacitance well junction ring width and length respectively, and dring is the depth of the depleted space charge region around perimeter capacitance well junction ring and is dominated by concentration of adjacent the second-type well region and the abruptness of the dopant grading between the first-type well region and the second-type well region which can be controlled with design optimization by increasing the distance between theses two well regions.

For Schottky junctions the dopant concentration, Nd, for the first-type well region is typically low and therefore the effective Schottky junction capacitance is small and the primary junction that requires optimization is the p-n junction created from the perimeter capacitance well junction ring that is positioned between and separates the first-type well region and the second-type well region.

As would be understood by those ordinarily skilled in the art, the foregoing structure can be made of many different materials, and can be manufactured according to a variety of different manufacturing processes. FIGS. 5-11 illustrate one exemplary process by which the foregoing structure can be manufactured; however, the embodiments herein are not limited to this specific process and instead include all possible processes, whether currently known or developed in the future can be used herein.

Figure 5:
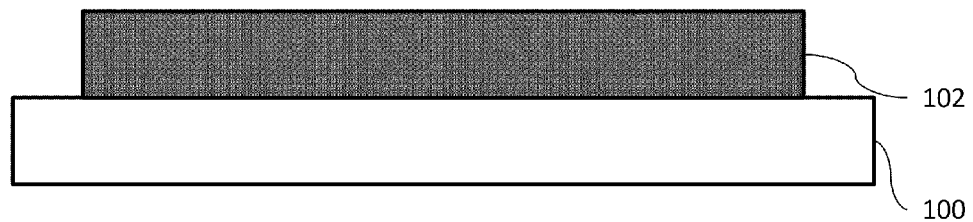
FIG. 5 is a cross-sectional schematic diagram of a partially completed integrated circuit according to embodiments herein.

More specifically, as illustrated in FIG. 5, this exemplary process begins with a substrate 100 that contains an impurity (that can be implanted, or the substrate can be formed from a material that includes an impurity (intrinsic)). In this example, the substrate contains a positive-type impurity, and is therefore referred to as a P-type substrate. The substrate can comprise any material appropriate for the given purpose (whether now known or developed in the future) and can comprise, for example, Si, SiC, SiGe, SiGeC, Ge alloys, GaAs, InAs, TnP, other III-V or II-VI compound semiconductors, or organic semiconductor structures etc. Further, the impurities mentioned herein can comprises any positive-type impurity (P-type impurity, e.g., phosphorus (P), arsenic (As), antimony (Sb) etc.) or any negative-type impurity (N-type impurity, e.g., boron, indium, etc.). The implantation processes herein can take any appropriate form (whether now known or developed in the future) and can comprise, for example, ion implantation, etc. Also, see U.S. Pat. No. 6,815, 317 (incorporated herein by reference) for a full discussion of implantation techniques.

As also shown in FIG. 5, this exemplary method forms a deep negative-type well isolation region 102 on the positive-type substrate 100. Once again, the negative-type well isolation region 102 can comprise a material that has an intrinsic impurity or one that is subsequently implanted with an impurity.

Further, as shown in FIG. 5, the negative type well isolation region 102 is patterned into various mesa structures (e.g., see FIG. 4) using any conventional patterning technique. One exemplary patterning technique forms a protective mask (such as an organic photoresist, a nitrite hard mask, etc.) over the areas that are not to be removed, and then performs an etching process to remove the exposed material. The various etching and material removal processes herein can comprise, for example, dry etching with a plasma of reactive gases such as fluorocarbons, oxygen, chlorine, boron trichloride; sometimes with addition of nitrogen, argon, helium and other gases; or wet etching (e.g., a buffered oxide etch, also known as buffered HF or BHF, using a mixture of a buffering agent, such as ammonium fluoride ($NH_4F$), and hydrofluoric acid (HF). Subsequently, the mask is removed and processing continues.

Figure 6:
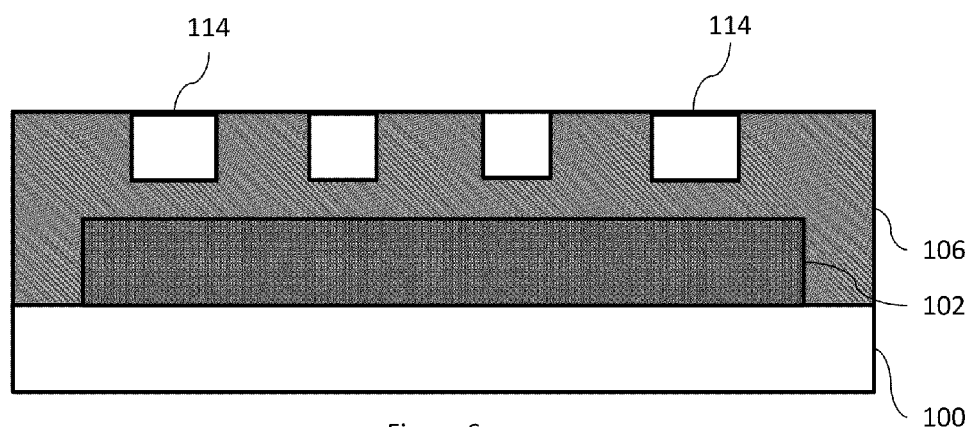
FIG. 6 is a cross-sectional schematic diagram of a partially completed integrated circuit according to embodiments herein.

As shown in FIG. 6, this exemplary method then forms (deposits or grows) a perimeter capacitance well junction ring 106 on the negative-type well isolation region 102. The method also forms a shallow trench isolation ring 114 on the perimeter capacitance well junction ring 106 in FIG. 6. Shallow trench isolation (STI) structures are well-known to those ordinarily skilled in the art and are generally formed by patterning openings and growing or filling the openings with a highly insulating material. The dielectrics (insulators) mentioned herein can, for example, be grown from either a dry oxygen ambient or steam. The thickness of dielectrics herein may vary contingent upon the required device performance. Alternatively, the dielectrics herein may be formed from any of the many candidate high dielectric constant (high-k) materials, including but not limited to silicon nitride, silicon oxynitride, $SiO_2$ and $Si_3N_4$, metal oxides like tantalum oxide, etc.

Figure 7:
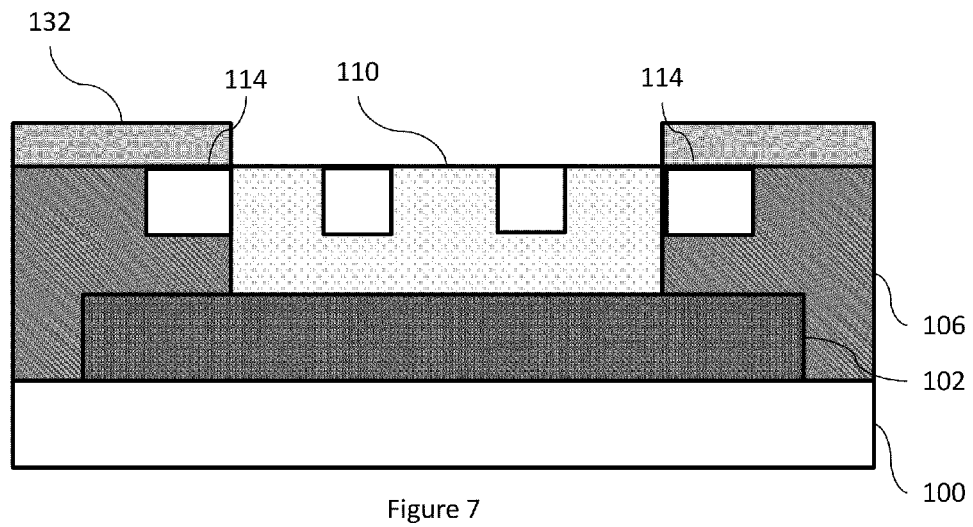
FIG. 7 is a cross-sectional schematic diagram of a partially completed integrated circuit according to embodiments herein.

Next, as shown in FIG. 7, a certain portion of the structure is protected with a mask 132 (such as any of the mask materials discussed above) and a portion of the perimeter capacitance well junction material 106 is removed (through any of the material removal processes mentioned above) or altered through an impurity implantation process. Within any opening thus created, a positive-type well region 110 can be formed on the negative-type well isolation region 102. This implantation (or material replacement) processing creates a perimeter capacitance well junction annual ring 106 that surrounds and contacts the positive-type well region 110 (e.g., see FIG. 3).

Figure 8:
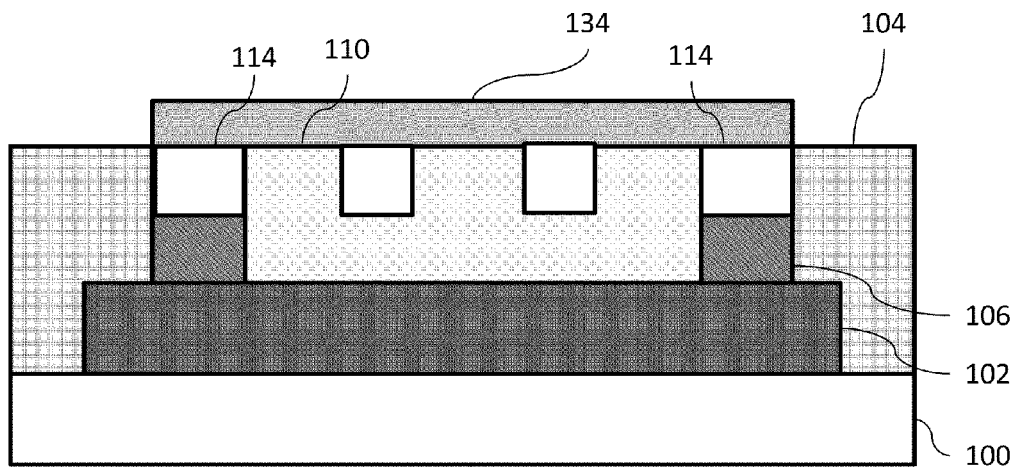
FIG. 8 is a cross-sectional schematic diagram of a partially completed integrated circuit according to embodiments herein.
Figure 9:
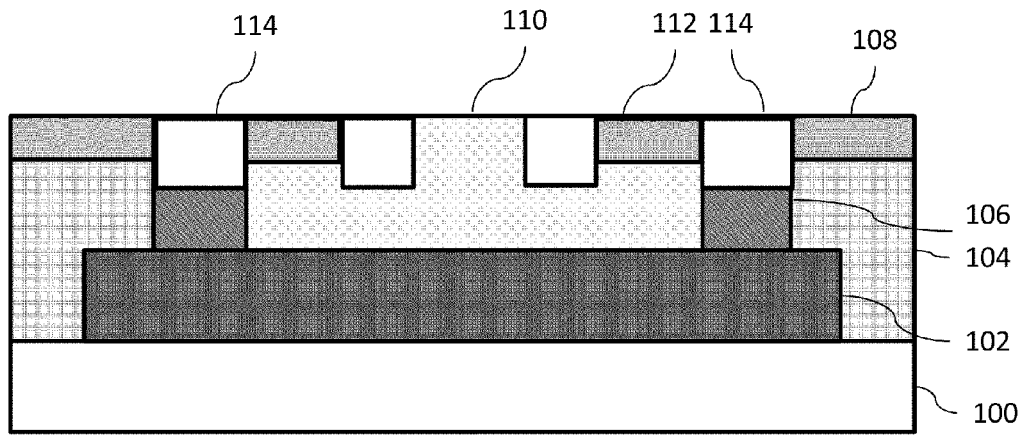
FIG. 9 is a cross-sectional schematic diagram of a partially completed integrated circuit according to embodiments herein.

Similarly, as shown in FIG. 8, a different portion of the structure is protected with a different mask 142 (such as any of the mask materials discussed above) and an impurity is implanted (or a material replacement process is performed) to form the negative-type well region 104 from the perimeter capacitance well junction material on the negative-type well isolation region 102. As shown in FIG. 3, this processing forms the structures such that the negative-type well region 104 surrounds and contacts the perimeter capacitance well junction ring 106, and such that the perimeter capacitance well junction ring 106 is positioned between and separates the positive-type well region 110 and the negative-type well region 104.

The perimeter capacitance well junction ring 106 can be formed from an undoped material, a positively doped material that has a doping concentration less than the positive-type well region 110, or a negatively doped material that has a doping concentration less than the negative-type well isolation region 108.

The mask 134 is removed and additional masking and impurity implant processes are performed to form the negative-type contact region 108 (from regions of the negative-type well region 104) and the positive-type contact region 112 (from regions of the positive-type well region 110). As shown in FIG. 2, the positive-type contact region 112 surrounds and contacts the inner portion of the positive-type well region 110, such that the inner portion of the positive-type well region 110 is positioned within the center of the positive-type contact region 112. Further, this processing results in the structure shown in FIG. 2, where the shallow trench isolation ring 114 is positioned between and separates the negative-type contact region 108 and the positive-type contact region 112.

Figure 10:
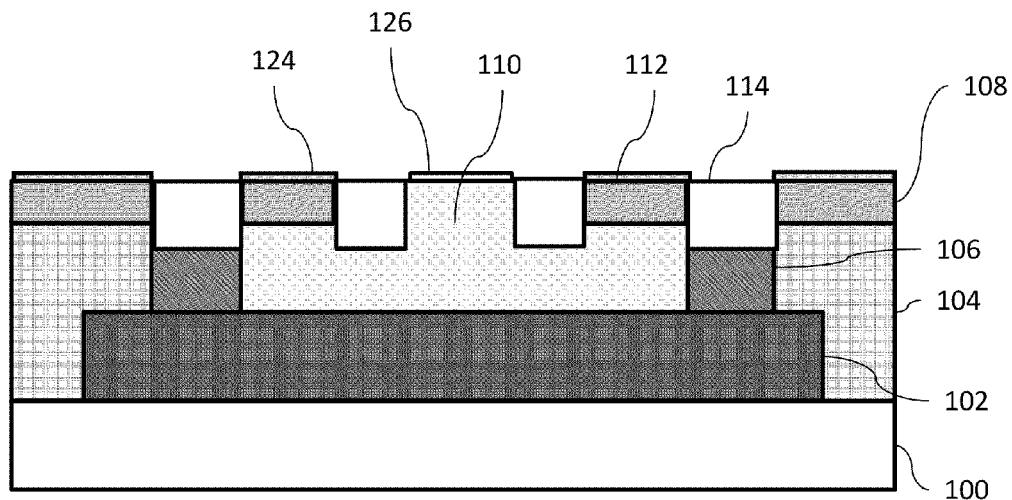
FIG. 10 is a cross-sectional schematic diagram of a partially completed integrated circuit according to embodiments herein.

As shown in FIG. 10, the method additionally forms silicides on the positive-type contact region 112 and/or the positive-type well region 110. As is well known to those ordinarily skilled in the art, silicides are formed by depositing a metal (such as tungsten, hafnium, tantalum, molybdenum, titanium, nickel, etc.) and then performing a number of annealing (heating) processes that allow the metal to bond with silicon surfaces to create silicides or salacides (self-aligned silicides). This process of forming the silicides forms a first ohmic metallic layer 124 on the positive-type contact region 112, and a second ohmic metallic layer 126 on the positive-type well region 110. The first ohmic metallic layer 124 contacts the second ohmic metallic layer 126 at a junction 118. This junction 118 comprises a Schottky barrier of the Schottky barrier diode.

Figure 11:
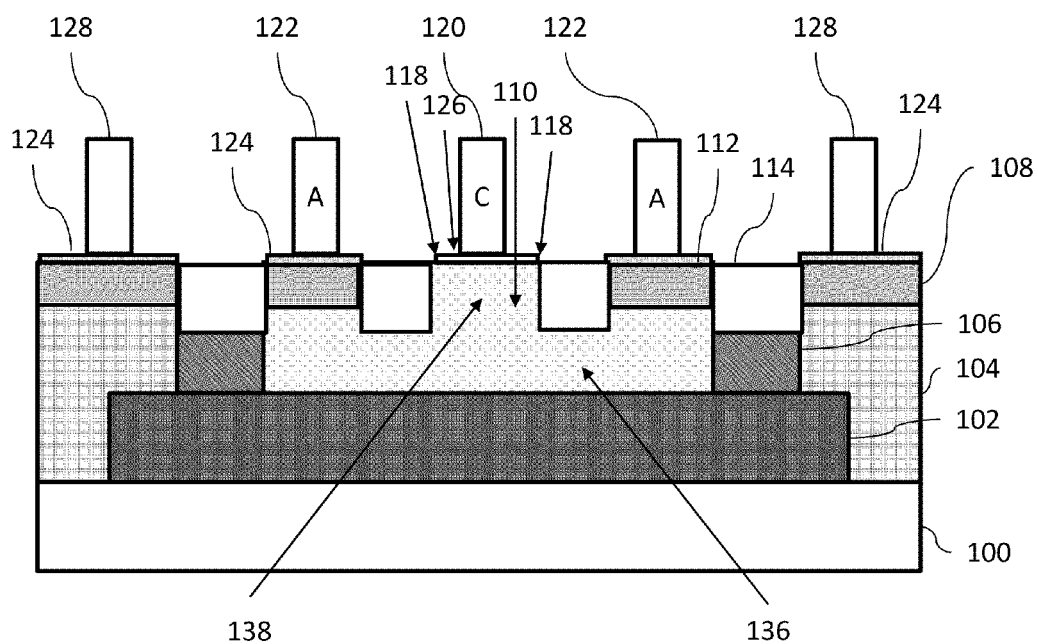
FIG. 11 is a cross-sectional schematic diagram of an integrated circuit according to embodiments herein.

As shown in FIG. 11, the various contacts 120, 122, 128 are formed from a conductive material using any of a patterning processes discussed above. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, and may be deposited using physical vapor deposition, chemical vapor deposition, or any other technique known in the art.

As also shown in FIG. 11, this processing forms the positive-type well region 110 to have a lower portion 136 that contacts the negative-type well isolation region, and the inner portion 138 that is surrounded by the positive-type contact region 112. Because of the creation of the positive-type contact region 112, the upper portion (inner portion) 138 of the positive-type well region 110 is formed to have a smaller circumference than the lower portion 136 of the positive-type well region 110.

Figure 12:
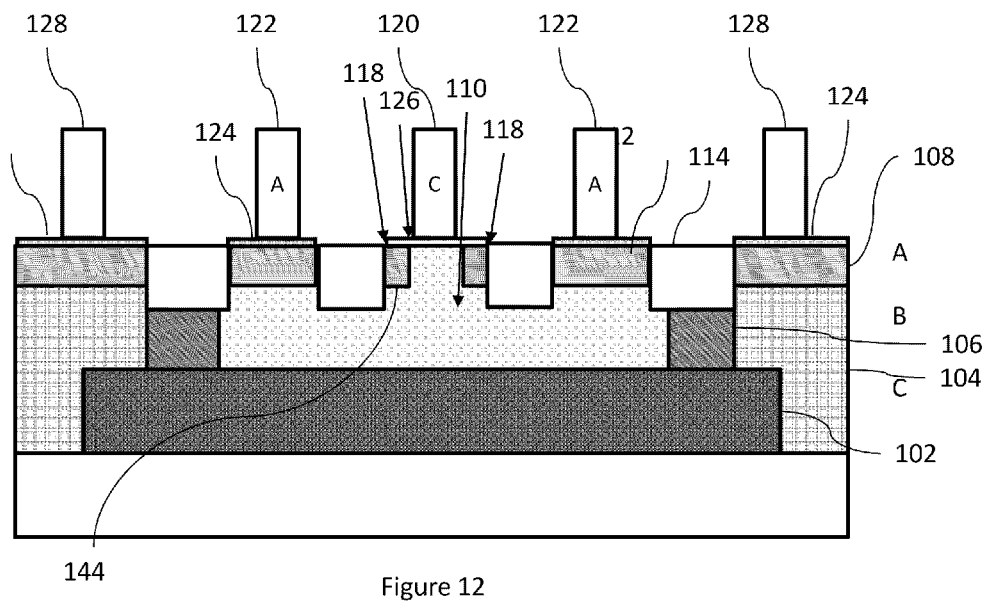
FIG. 12 is a cross-sectional schematic diagram of an integrated circuit according to embodiments herein.

FIG. 12 illustrates an alternative embodiment that includes a guard ring 144. As is well-known to those ordinarily skilled in the art, the guard ring can comprise a lightly doped region used to reduce or eliminate edge effects by reducing the electrical field concentrations and by moving the edge of the electrode away from the Schottky barrier junction. Therefore, for example, guard ring 144 can be formed in the processing shown in FIG. 9 (or at any other appropriate place in the processing discussed above) through the formation of a lightly doped region 144.

Figure 13:
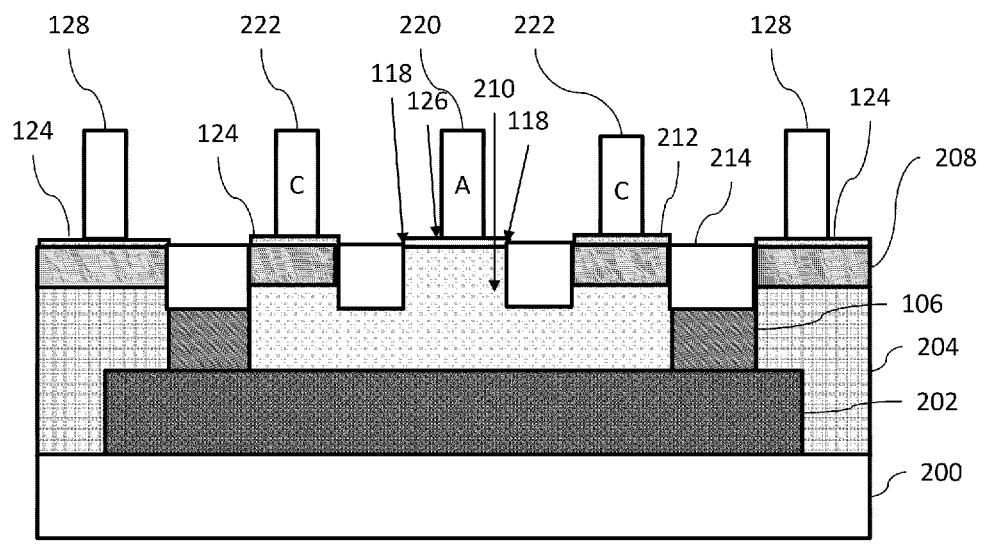
FIG. 13 is a cross-sectional schematic diagram of an integrated circuit according to embodiments herein.

While the foregoing discussion relates to a positive-type diode, those ordinarily skilled in the art would understand that the polarities of the impurities could be reversed to create a negative-type diode, such as that illustrated in FIG. 13. The process discussed above could be utilized (with opposite polarity of impurity implants) to create the structure that is the same as that discussed above, except that as shown in FIG. 13, this structure includes an N-type substrate 200, a deep P-well isolation layer 202, a P-well isolation region 204, a P-type contact 208, an N-well region 210, and an N-type contact 212. Further, as would be understood by those ordinarily skilled in the art, with the structure shown in FIG. 13, the anodes (220) and the cathodes (222) are reversed from the P-type Schottky diode illustrated in FIG. 11.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 14:
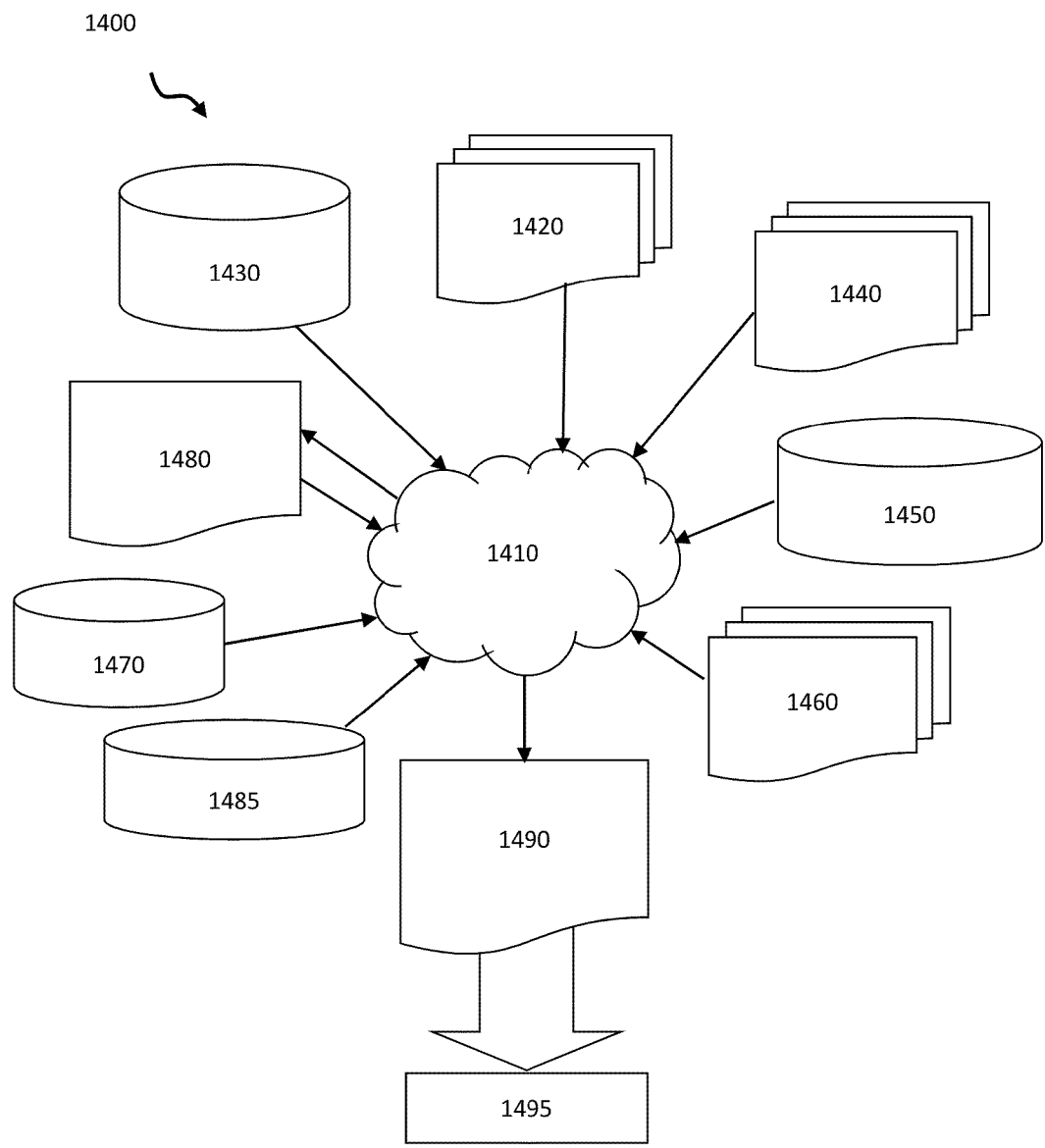
FIG. 14 is a flow diagram of a design process used in semiconductor design, manufacture, and/or test.

FIG. 14 shows a block diagram of an exemplary design flow 1400 used for example, in semiconductor design, manufacturing, and/or test. Design flow 1400 may vary depending on the type of IC being designed. For example, a design flow 1400 for building an application specific IC (ASIC) may differ from a design flow 1400 for designing a standard component. Design structure 1420 is preferably an input to a design process 1410 and may come from an IP provider, a core developer, or other design company or may be generated by the operator of the design flow, or from other sources.

Design structure 1420 comprises an embodiment of the invention as shown in FIGS. 1-13 in the form of schematics or HDL, a hardware-description language (e.g., Verilog, VHDL, C, etc.). Design structure 1420 may be contained on one or more non-transitory machine-readable medium. For example, design structure 1420 may be a text file or a graphical representation of an embodiment of the invention as shown FIGS. 1-13.

Design process 1410 preferably synthesizes (or translates) an embodiment of the invention as shown in FIGS. 1-13 into a netlist 1480, where netlist 1480 is, for example, a list of wires, transistors, logic gates, control circuits, I/O, models, etc. that describes the connections to other elements and circuits in an integrated circuit design and recorded on at least one of machine readable medium. This may be an iterative process in which netlist 1480 is resynthesized one or more times depending on design specifications and parameters for the circuit.

Design process 1410 may include using a variety of inputs; for example, inputs from library elements 1430 which may house a set of commonly used elements, circuits, and devices, including models, layouts, and symbolic representations, for a given manufacturing technology (e.g., different technology nodes, 32 nm, 45 nm, 90 nm, etc.), design specifications 1440, characterization data 1450, verification data 1460, design rules 1470, and test data files 1485 (which may include test patterns and other testing information).

Design process 1410 may further include, for example, standard circuit design processes such as timing analysis, verification, design rule checking, place and route operations, etc. One of ordinary skill in the art of integrated circuit design can appreciate the extent of possible electronic design automation tools and applications used in design process 1410 without deviating from the scope and spirit of the invention. The design structure of the invention is not limited to any specific design flow.

Design process 1410 preferably translates an embodiment of the invention as shown in FIGS. 1-13, along with any additional integrated circuit design or data (if applicable), into a second design structure 1490. Design structure 1490 resides on a storage medium in a data format used for the exchange of layout data of integrated circuits (e.g. information stored in a GDSII (GDS2), GL1, OASIS, or any other suitable format for storing such design structures). Design structure 1490 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-13. Design structure 1490 may then proceed to a stage 1495 where, for example, design structure 1490: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A Schottky barrier diode comprising:
   a first-type substrate;
   a second-type well isolation region on said first-type substrate, a first-type well region on said second-type well isolation region;
   a perimeter capacitance well junction ring on said second-type well isolation region;
   a second-type well region on said second-type well isolation region, said perimeter capacitance well junction ring being positioned between and separating said first-type well region and said second-type well region;
   a second-type contact region on said second-type well region;
   a first-type contact region contacting an inner portion of said first-type well region, said inner portion of said first-type well region being positioned within a center of said first-type contact region;
   a first ohmic metallic layer on said first-type contact region; and
   a second ohmic metallic layer on said first-type well region, said first ohmic metallic layer contacting said second ohmic metallic layer at a junction, said junction comprising a Schottky barrier of said Schottky barrier diode; and
   said second-type well region having a lower portion contacting said first-type substrate, said lower portion of said second-type well region surrounding said second-type well isolation region.

2. The Schottky barrier diode according to claim 1, said perimeter capacitance well junction ring comprising one of:
   an undoped material;
   a first-type doped material having a doping concentration less than said first-type well region; and
   a second-type doped material having a doping concentration less than said first-type well region.

3. The Schottky barrier diode according to claim 1, said first-type well region comprising a lower portion contacting said second-type well isolation region, and
   said inner portion of said first-type well region having a smaller circumference than said lower portion of said first-type well region.

4. The Schottky barrier diode according to claim 1, said lower portion of said second-type well region contacting said second-type well isolation region.

5. The Schottky barrier diode according to claim 1, said second-type contact region having a greater doping concentration than said second-type well region; and
   said first-type contact region having a greater doping concentration than said first-type well region.

6. A positive-type Schottky barrier diode comprising:
a positive-type substrate;
a negative-type well isolation region positioned on and contacting said positive-type substrate;
a positive-type well region positioned on and contacting said negative-type well isolation region;
a perimeter capacitance well junction ring positioned on and contacting said negative-type well isolation region, said perimeter capacitance well junction ring surrounding and contacting said positive-type well region;
a negative-type well region positioned on and contacting said negative-type well isolation region, said negative-type well region surrounding and contacting said perimeter capacitance well junction ring, said perimeter capacitance well junction ring being positioned between and separating said positive-type well region and said negative-type well region;
a negative-type contact region positioned on and contacting said negative-type well region;
a positive-type contact region surrounding and contacting an inner portion of said positive-type well region, said inner portion of said positive-type well region being positioned within a center of said positive-type contact region;
a shallow trench isolation ring positioned on and contacting said perimeter capacitance well junction ring, said shallow trench isolation ring being positioned between and separating said negative-type contact region and said positive-type contact region;
a first ohmic metallic layer on said positive-type contact region; and
a second ohmic metallic layer on said positive-type well region, said first ohmic metallic layer contacting said second ohmic metallic layer at a junction, said junction comprising a Schottky barrier of said Schottky barrier diode.

7. The positive-type Schottky barrier diode according to claim 6, said perimeter capacitance well junction ring comprising one of:
an undoped material;
a positively doped material having a doping concentration less than said positive-type well region; and
a negatively doped material having a doping concentration less than said positive-type well region.

8. The positive-type Schottky barrier diode according to claim 6, said positive-type well region comprising a lower portion contacting said negative-type well isolation region, and
said inner portion of said positive-type well region having a smaller circumference than said lower portion of said positive-type well region.

9. The positive-type Schottky barrier diode according to claim 6, said negative-type well region having a lower portion contacting said positive-type substrate, said lower portion of said negative-type well region contacting and surrounding said negative-type well isolation region.

10. The positive-type Schottky barrier diode according to claim 6, said negative-type contact region having a greater doping concentration than said negative-type well region; and
said positive-type contact region having a greater doping concentration than said positive-type well region.

11. A method of forming a Schottky barrier diode comprising:
forming a second-type well isolation region on a first-type substrate;
forming a first-type well region on said second-type well isolation region;
forming a perimeter capacitance well junction ring on said second-type well isolation region;
forming a second-type well region on said second-type well isolation region, such that said perimeter capacitance well junction ring is positioned between and separates said first-type well region and said second-type well region;
forming a second-type contact region on said second-type well region;
forming a first-type contact region that surrounds and contacts an inner portion of said first-type well region, such that said inner portion of said first-type well region is positioned within a center of said first-type contact region; and
forming silicides on at least said first-type contact region and said first-type well region,
said forming of said silicides forming a first ohmic metallic layer on said first-type contact region, and a second ohmic metallic layer on said first-type well region, and
said first ohmic metallic layer contacting said second ohmic metallic layer at a junction, said junction comprising a Schottky barrier of said Schottky barrier diode; and
said second-type well region being formed to have a lower portion that contacts said first-type substrate, and such that said lower portion of said second-type well region surrounds said second-type well isolation region.

12. The method of forming a Schottky barrier diode according to claim 11, said perimeter capacitance well junction ring being formed to comprise one of:
an undoped material;
a first-type doped material having a doping concentration less than said first-type well region; and
a second-type doped material having a doping concentration less than said first-type well region.

13. The method of forming a Schottky barrier diode according to claim 11, said first-type well region being formed to comprise a lower portion that contacts said second-type well isolation region, and said inner portion of said first-type well region being formed to have a smaller circumference than said lower portion of said first-type well region.

14. The method of forming a Schottky barrier diode according to claim 11, said lower portion of said second-type well region being formed to contact said second-type well isolation region.

15. The method of forming a Schottky barrier diode according to claim 11, said second-type contact region being formed to have a greater doping concentration than said second-type well region; and
said first-type contact region being formed to have a greater doping concentration than said first-type well region.

16. A method of forming a positive-type Schottky barrier diode comprising:
forming a negative-type well isolation region on a positive-type substrate;
forming a positive-type well region on said negative-type well isolation region;
forming a perimeter capacitance well junction ring on said negative-type well isolation region, such that said perimeter capacitance well junction ring surrounds and contacts said positive-type well region;
forming a negative-type well region on said negative-type well isolation region, such that said negative-type well region surrounds and contacts said perimeter capacitance well junction ring, and such that said perimeter capacitance well junction ring is positioned between and separates said positive-type well region and said negative-type well region;

forming a negative-type contact region on said negative-type well region;

forming a positive-type contact region that surrounds and contacts an inner portion of said positive-type well region, such that said inner portion of said positive-type well region is positioned within a center of said positive-type contact region;

forming a shallow trench isolation ring on said perimeter capacitance well junction ring, such that said shallow trench isolation ring is positioned between and separates said negative-type contact region and said positive-type contact region; and forming silicides on at least said positive-type contact region and said positive-type well region, said forming of said silicides forming a first ohmic metallic layer on said positive-type contact region, and a second ohmic metallic layer on said positive-type well region, and said first ohmic metallic layer contacting said second ohmic metallic layer at a junction, said junction comprising a Schottky barrier of said Schottky barrier diode.

17. The method of forming a positive-type Schottky barrier diode according to claim 16, said perimeter capacitance well junction ring being formed to comprise one of:
an undoped material;
a positively doped material having a doping concentration less than said positive-type well region; and
a negatively doped material having a doping concentration less than said positive-type well region.

18. The method of forming a positive-type Schottky barrier diode according to claim 16, said positive-type well region being formed to comprise a lower portion that contacts said negative-type well isolation region, and said inner portion of said positive-type well region being formed to have a smaller circumference than said lower portion of said positive-type well region.

19. The method of forming a positive-type Schottky barrier diode according to claim 16, said negative-type well region being formed to have a lower portion that contacts said positive-type substrate, and such that said lower portion of said negative-type well region contacts and surrounds said negative-type well isolation region.

20. The method of forming a positive-type Schottky barrier diode according to claim 16, said negative-type contact region being formed to have a greater doping concentration than said negative-type well region; and
said positive-type contact region being formed to have a greater doping concentration than said positive-type well region.

21. A design structure embodied in a machine readable medium used in a design process, said design structure comprising a Schottky barrier diode comprising:
a first-type substrate;
a second-type well isolation region on said first-type substrate, a first-type well region on said second-type well isolation region;
a perimeter capacitance well junction ring on said second-type well isolation region;
a second-type well region on said second-type well isolation region, said perimeter capacitance well junction ring being positioned between and separating said first-type well region and said second-type well region;
a second-type contact region on said second-type well region;
a first-type contact region contacting an inner portion of said first-type well region, said inner portion of said first-type well region being positioned within a center of said first-type contact region;
a first ohmic metallic layer on said first-type contact region; and
a second ohmic metallic layer on said first-type well region, said first ohmic metallic layer contacting said second ohmic metallic layer at a junction, said junction comprising a Schottky barrier of said Schottky barrier diode,
said second-type well region having a lower portion contacting said first-type substrate, said lower portion of said second-type well region surrounding and contacting said second-type well isolation region.

22. The design structure of claim 21, wherein the design structure comprises a netlist.

23. The design structure of claim 21, wherein the design structure resides on storage medium as a data format used for the exchange of layout data of integrated circuits.

24. The design structure of claim 21, wherein the design structure includes at least one of test data, characterization data, verification data, or design specifications.

* * * * *